United States Patent
Minamihaba et al.

(10) Patent No.: US 7,364,667 B2
(45) Date of Patent: Apr. 29, 2008

(54) SLURRY FOR CMP AND CMP METHOD

(75) Inventors: Gaku Minamihaba, Kawasaki (JP); Hiroyuki Yano, Yokohama (JP)

(73) Assignee: Kabushiki Kaisha Toshiba, Kawasaki-shi (JP)

( * ) Notice: Subject to any disclaimer, the term of this patent is extended or adjusted under 35 U.S.C. 154(b) by 758 days.

(21) Appl. No.: 10/155,015

(22) Filed: May 28, 2002

(65) Prior Publication Data

US 2002/0148997 A1 Oct. 17, 2002

Related U.S. Application Data

(60) Provisional application No. 09/527,600, filed on Mar. 17, 2000, now Pat. No. 6,444,139.

(30) Foreign Application Priority Data

Mar. 17, 1999 (JP) .................. 11-071610

(51) Int. Cl.
*C09K 13/00* (2006.01)

(52) U.S. Cl. .................. 252/79.1; 106/3; 510/221; 510/245; 51/309; 216/88; 216/89; 216/100

(58) Field of Classification Search .............. 216/88, 216/89, 100; 252/79.1; 510/221, 245, 395, 510/418; 51/309; 106/3
See application file for complete search history.

(56) References Cited

U.S. PATENT DOCUMENTS

| 4,036,950 | A | * | 7/1977 | Baines et al. .................. 424/54 |
| 4,183,788 | A | * | 1/1980 | Fromson et al. ......... 430/278.1 |
| 4,264,529 | A | * | 4/1981 | Dunn ........................ 564/418 |
| 4,659,504 | A | * | 4/1987 | Hayes ........................ 516/102 |
| 5,051,164 | A | * | 9/1991 | Herbst et al. .......... 208/120.15 |
| 5,693,239 | A | * | 12/1997 | Wang et al. ................... 216/88 |
| 5,783,489 | A | * | 7/1998 | Kaufman et al. ........... 438/692 |
| 5,972,863 | A |  | 10/1999 | Heo et al. ................... 510/175 |
| 5,997,620 | A |  | 12/1999 | Kodama et al. ............... 106/3 |
| 6,077,337 | A |  | 6/2000 | Lee ............................... 106/3 |
| 6,083,419 | A |  | 7/2000 | Grumbine et al. ......... 252/79.1 |
| 6,149,895 | A | * | 11/2000 | Kutsch ........................ 424/53 |

FOREIGN PATENT DOCUMENTS

| EP | 0 845 512 A1 | 6/1998 |
| JP | 63-166713 | 7/1988 |
| JP | 7-193034 | 7/1995 |
| JP | 8-3540 | 1/1996 |
| JP | 10-46140 | 2/1998 |
| JP | 10-279926 | 10/1998 |

\* cited by examiner

*Primary Examiner*—Shamim Ahmed
(74) *Attorney, Agent, or Firm*—Finnegan, Henderson, Farabow, Garrett & Dunner, L.L.P.

(57) ABSTRACT

A CMP slurry comprising polishing abrasives containing mixture abrasives of silica and alumina is used. In CMP using the slurry comprising mixture abrasives of silica and alumina as polishing abrasives, a down force-dependency of a polishing rate is high and an increase in dishing can be effectively suppressed.

4 Claims, 4 Drawing Sheets

US 7,364,667 B2

SLURRY FOR CMP AND CMP METHOD

CROSS-REFERENCE TO RELATED APPLICATION

This application is a division of application Ser. No. 09/527,600, filed Mar. 17, 2000, now U.S. Pat. No. 6,444,139, which is incorporated by reference herein in its entirety. This application is also based upon and claims the benefit of priority from prior Japanese Patent Application No. 11-071610, filed Mar. 17, 1999, the entire contents of which are incorporated herein by reference.

BACKGROUND OF THE INVENTION

The present invention relates to a slurry for CMP (Chemical Mechanical Polishing) and a CMP method which are effective in grinding a metal film such as an Al film, a W film or a Cu film.

In these years, in the field of fabrication of semiconductor devices, various microfabrication techniques have been researched and developed to promote microfabrication and higher integration concentration. Among them, CMP techniques are very important in forming Damascene wiring.

In conventional metal CMP techniques, a slurry containing alumina abrasives as a basic component is used. The reasons are that alumina itself has a high polishing performance and alumina abrasives have good dispersivity in a strong acid (pH: ~2) such as nitric acid, which is widely used as an oxidizing agent.

The alumina-based slurry, however, has three problems.

First, in order to polish a metal film such as a Cu film or an Al film, the pH of the slurry needs to be set at an approximately neutral value. However, since alumina-based slurry has unstable dispersivity near the neutral value, it is difficult to obtain stable polishing characteristics.

Second, an adequate selectivity ratio of a metal film to an insulating film (i.e. metal film polishing rate/insulating film ($SiO_2$) polishing rate) cannot be maintained. Where Damascene wiring is to be formed, it is necessary to maintain an adequate selectivity ratio of a metal film to an $SiO_2$ film. In general, for this purpose, the alumina concentration is reduced to lower the $SiO_2$ film polishing rate. However, the metal film polishing rate is also reduced at the same time. Consequently, it is difficult to obtain a high selectivity ratio, and thinning of the $SiO_2$ film cannot be suppressed.

Third, dishing (formation of a dish-like concave in a metal film within a trench) will occur to a great degree. In particular, it is not possible to form Damascene wiring with a small over-polishing margin and a uniform depth over an entire surface of a wafer. To overcome this problem, a hard polishing pad with low elastic deformation is used. In the case of a soft material such as aluminum, however, the use of the hard polishing pad requires a trade-off between reduction of dishing and occurrence of flaws. Therefore, unless the slurry is devised, this problem is difficult to solve.

There is an attempt to carry out metal CMP using a slurry containing silica abrasives as a main component. In this case, however, an adequate polishing rate is not achieved, and morphology of a polished face is not good.

As has been described above, in the conventional metal CMP, the alumina-grain-based slurry has been used. Where this kind of slurry is used, it is difficult to obtain stable polishing characteristics near the neutral value of pH or to maintain an adequate selectivity ratio of a metal film to an insulating film. Moreover, dishing will occur to a great degree.

BRIEF SUMMARY OF THE INVENTION

The object of the present invention is to provide a CMP slurry and a CMP method capable of achieving stable polishing characteristics near a neutral pH value, high selectivity between an insulating film and a conductive film, and suppression of dishing.

In the present invention, a CMP slurry to be used contains polishing abrasives comprising mixture abrasives of silica and alumina. Where a slurry containing, as polishing abrasives, mixture abrasives of silica and alumina is used in CMP, a polishing rate is greatly dependent on a down force, and an increase in dishing can be effectively suppressed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will now be described with reference to the accompanying drawings.

FIRST EMBODIMENT

Figure 1A:
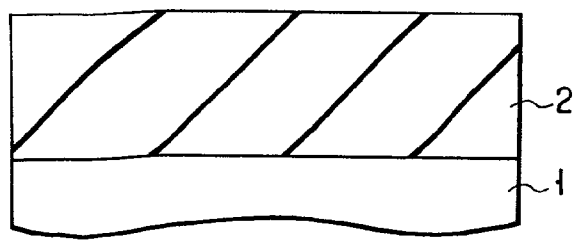
FIGS. 1A to 1C are cross-sectional views illustrating a process of forming Al Damascene wiring according to a first embodiment of the present invention.
Figure 1B:
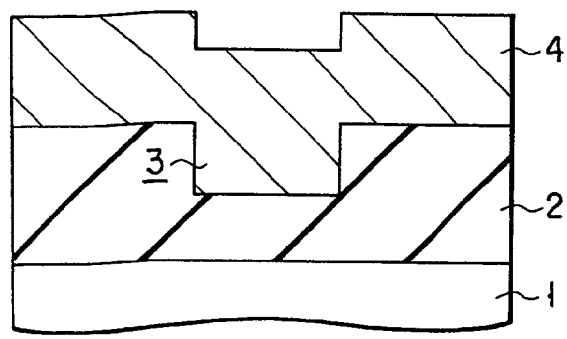
Figure 1C:
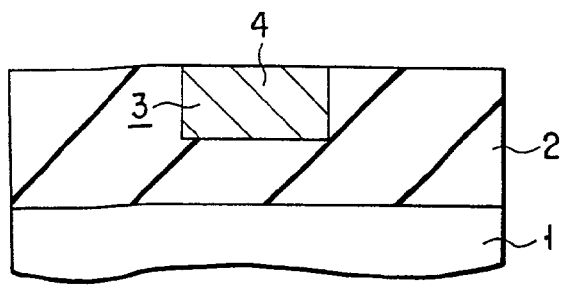

FIGS. 1A to 1C are cross-sectional views illustrating steps of a process of forming Al Damascene wiring according to a first embodiment of the present invention.

To start with, as shown in FIG. 1A, an $SiO_2$ film 2 which serves as an interlayer insulating film is deposited on a silicon substrate 1 on which devices (not shown) are fabricated.

A wiring trench 3 is formed in a surface portion of the $SiO_2$ film 2, as shown in FIG. 1B. Then, an Al film 4 for filling the wiring trench 3 is deposited on an entire surface of the resultant structure to a thickness of 600 nm.

At last, as shown in FIG. 1C, an excess portion of the Al film 4 outside the wiring trench 3 is removed by CMP using a slurry containing, as polishing abrasives, mixture (mixed-crystal) abrasives of silica and alumina and having a pH of 7. Thus, Al Damascene wiring 4 is completely formed.

Figure 2:
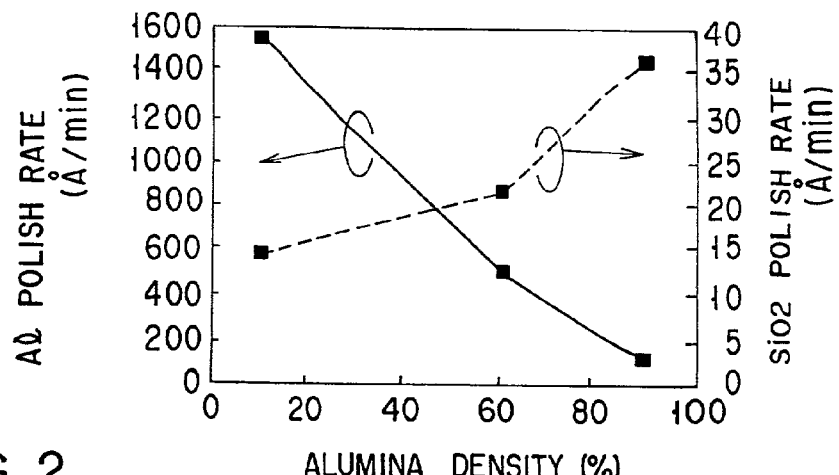
FIG. 2 is a characteristic graph showing a relationship between an alumina concentration in mixture abrasives of silica and alumina (alumina/silica mixed crystal ratio) and a selectivity ratio (Al film polishing rate/$SiO_2$ film polishing rate)

Using the slurry according to the present embodiment, selectivity of the Al film to $SiO_2$ film (Al polishing rate/$SiO_2$ polishing rate) can be controlled, as shown in FIG. 2, merely by varying the alumina concentration [%] of alumina to silica (alumina/silica mixture ratio).

For example, if CMP is carried out using a slurry containing mixture abrasives (solid component: 3%) of silica (silica concentration=90%) and alumina (alumina concentration=10%) and having a pH of 7, under conditions of a down force being 300 $g/cm^2$, a top ring rotational speed being 60 rpm, and a table rotational speed being 100 rpm, the selectivity ratio of the Al film to the $SiO_2$ film becomes 106 (=Al polishing rate: 159 [nm/min]/$SiO_2$ polishing rate: 1.5 [nm/min]).

In the prior-art CMP, the selectivity ratio of 30 at most is obtained. According to the present embodiment, the selectivity ratio is three times as high as in the prior art. Therefore, according to this embodiment, compared to the prior art, the Al Damascene wiring 4 with much less thinning than in the prior art can be achieved. Besides, in a second embodiment, as will be described later, an increase in dishing can be effectively suppressed.

According to the present embodiment, a polishing rate higher than in the prior art is obtained. Therefore, the slurry concentration can be decreased while the higher polishing rate is maintained. If the slurry concentration is decreased, the manufacturing cost can be reduced accordingly, and the amount of waste slurry is also reduced. Thus, an environmentally friendly process can be realized.

The surface charge and hardness of particles can be controlled by the mixture.

SECOND EMBODIMENT

FIGS. 3A to 3D are cross-sectional views illustrating steps of a process of forming Al Damascene wiring according to a second embodiment of the present invention. This embodiment is directed to a method of forming Al Damascene wiring, in which an Nb film is used as a liner film.

Figure 3A:
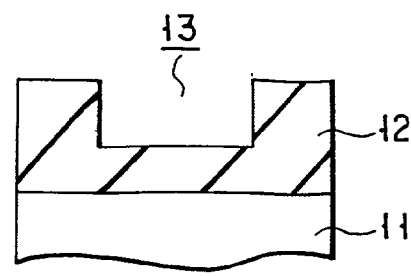
FIGS. 3A to 3D are cross-sectional views illustrating a process of forming Al Damascene wiring according to a second embodiment of the present invention.

As is shown in FIG. 3A, an SOG (Spin on Glass) film 12 is deposited as an interlayer insulating film on a silicon substrate 11. A wiring trench 13 is formed in a surface portion of the SOG film 12. The steps thus far are common to the first embodiment, except for the kind of the interlayer insulating film.

Figure 3B:
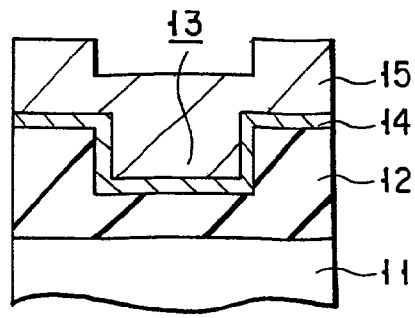

As is shown in FIG. 3B, an Nb liner film 14 with a thickness of 30 nm is deposited over an entire surface of the resultant structure. Then, an Al film 15 with a thickness of 600 nm for filling the wiring trench 13 is deposited on the Nb liner film 14.

In a subsequent step, as illustrated in step 3C, the Al film 15 is polished by CMP until the surface of the Nb liner film 14 appears, using a slurry containing mixture abrasives (solid component: 0.5%) of silica (silica concentration=40%) and alumina (alumina concentration=60%) as polishing abrasives, having a pH of 4 to 6.5, and containing 1% of ammonium peroxodisulfate as an oxidizing agent and 0.05% of quinaldic acid for enhancing a retention force of abrasives on a polishing pad and suppressing oxidation. The conditions for the CMP are: a down force=300 $g/cm^2$, a top ring rotational speed=120 rpm, a table rotational speed=100 rpm, and a polishing time=2 minutes.

The reason why the slurry containing ammonium peroxodisulfate and quinaldic acid is used in this step is that the rate of polishing the Al film 15 can thereby be increased.

Figure 4:
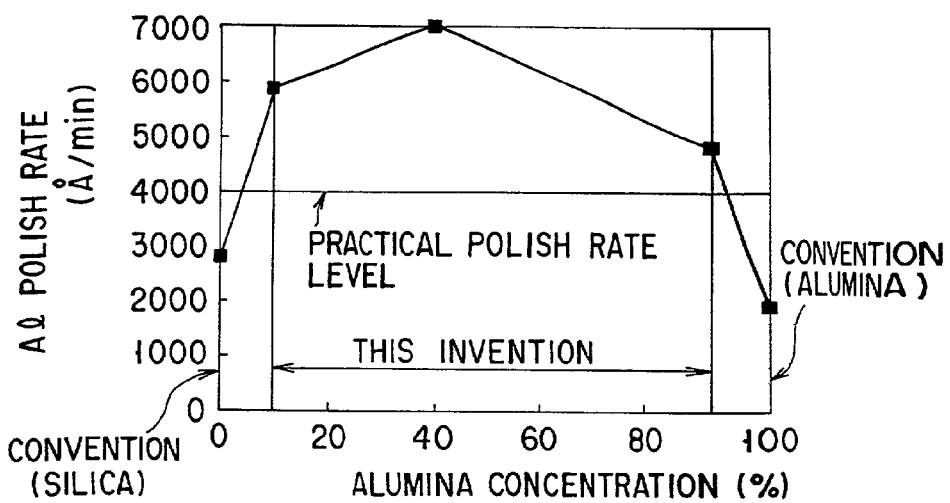
FIG. 4 is a characteristic graph showing Al polishing rates in the second embodiment in cases where oxidizing agents are added to a slurry containing mixture abrasives of silica and alumina, a silica-based slurry, and an alumina-based slurry.

Specifically, where an oxidizing agent is added to the conventional silica-based slurry and alumina-based slurry, respectively, the Al film polishing rates are 200 nm/min and 280 nm/min at most, as shown in FIG. 4. On the other hand, where ammonium peroxodisulfate and quinaldic acid are added to the slurry containing mixture abrasives of silica and alumina as polishing abrasives, the Al film polishing rate is 700 nm/min. According to this embodiment, the polishing rate twice as high as in the prior art can be attained.

The thickness of the Al film 15 is normally 600 to 800 nm. On the other hand, it is desirable that the polishing time for the Al film 15 be about two minutes from the standpoint of through-put. Unless the slurry of this embodiment is used, it is difficult to remove the excess portion of the Al film 15 in such a desirable polishing time.

The ammonium peroxodisulfate used as an oxidizing agent is also advantageous in that it does not shift the pH of the slurry to acidity too much. The above-described advantages can also be obtained in the case where aqueous hydrogen peroxide is used as an oxidizing agent.

Figure 3C:
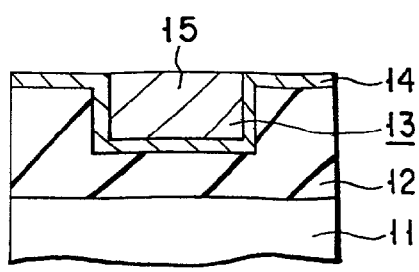

If the step illustrated in FIG. 3C is carried out using the conventional slurry, dishing of the Al film 15, which is a problem in the prior art, will occur to a large degree. According to the present method, occurrence of dishing can be effectively suppressed.

Figure 5:
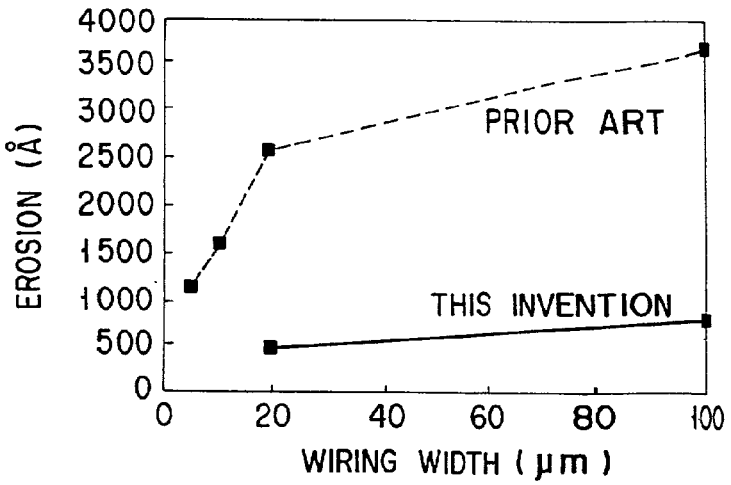
FIG. 5 is a characteristic graph showing a relationship between wiring width and dishing in the second embodiment in cases where a slurry containing mixture abrasives of silica and alumina and an alumina-based slurry are used.

Over-polishing (just value+50%) was actually conducted, and the dependency of dishing upon wiring width was examined. It turned out, as shown in FIG. 5, that the dishing was suppressed to about ⅕ of dishing in the prior art according to the present method.

The reason for this appears to be that compared to the conventional polishing abrasives, the mixture abrasives of silica and alumina (in the present invention) have a high down force-dependency of polishing rate, that is, the polishing rate greatly increases in accordance with an increase in down force.

Figure 6A:
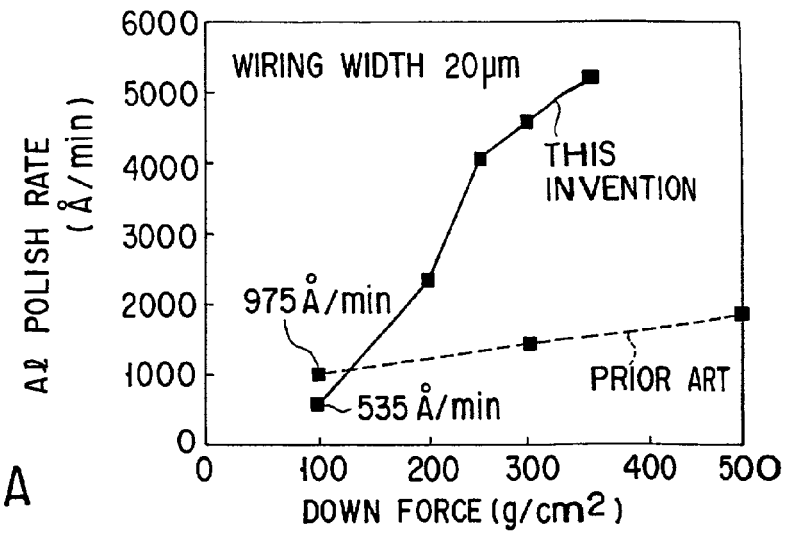
FIG. 6A is a characteristic graph showing a relationship between a down force and an Al polishing rate in the second embodiment in cases where a slurry containing mixture abrasives of silica and alumina and an alumina-based slurry are used.
Figure 6B:
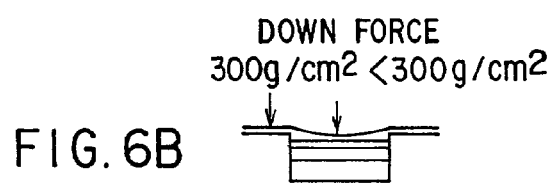
FIG. 6B illustrates a difference in down force due to locations in the second embodiment.

The reason is as follows. In the polishing step, polishing on the upper surface of the Al film 15 within the wiring trench 3 progresses due to elastic deformation of the pad. Basically, a low down force acts on this region, as shown in FIG. 6B, while a high down force acts on the other region, i.e. the SOG film 12. The degree of dishing decreases as the down force decreases and the polishing rate obtainable with the slurry lowers.

Accordingly, if the slurry containing polishing abrasives, with which the polishing rate greatly increases in accordance with an increase in down force, such as mixture abrasives of silica and alumina, is used, the occurrence of dishing can be effectively suppressed.

In addition, since the use of mixture abrasives of silica and alumina can provide a high polishing rate on the SOG film 12 (the polishing rate being 700 nm/min at a down force of, e.g. 300 g/cm$^2$), the over-polishing time can be reduced.

Figure 3D:
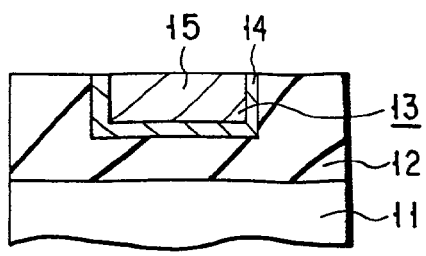

At last, as shown in FIG. 3D, excess portions of the Al film 15 and Nb liner film 14 outside the wiring trench 13 are removed by dry etching such as CMP or CDE (Chemical Dry Etching), the formation of the Al Damascene wiring 15 is completed.

Where the excess portions are removed by CMP, a slurry containing, for example, mixture abrasives (solid component: 3%) of silica (40%) and alumina (60%) as polishing abrasives, 0.05% of quinaldic acid and 0.01% of surfactant SDS is used. The surfactant can prevent scratches caused by a heteroagglomeration of abrasives and other material (products in CMP etc).

In the case of so-called touch-up CMP (e.g. CMP illustrated in FIG. 8C), a soft polishing pad is used in order to remove a residue of a metallic film in the trench or eliminate flaws on the wiring or insulating film. Consequently, dishing will occur to a great degree. For example, this process is carried out under the conditions of, for example, the down force being 300 g/cm$^2$, the top ring rotational speed being 60 rpm, and the table rotational speed being 100 rpm.

Figure 7A:
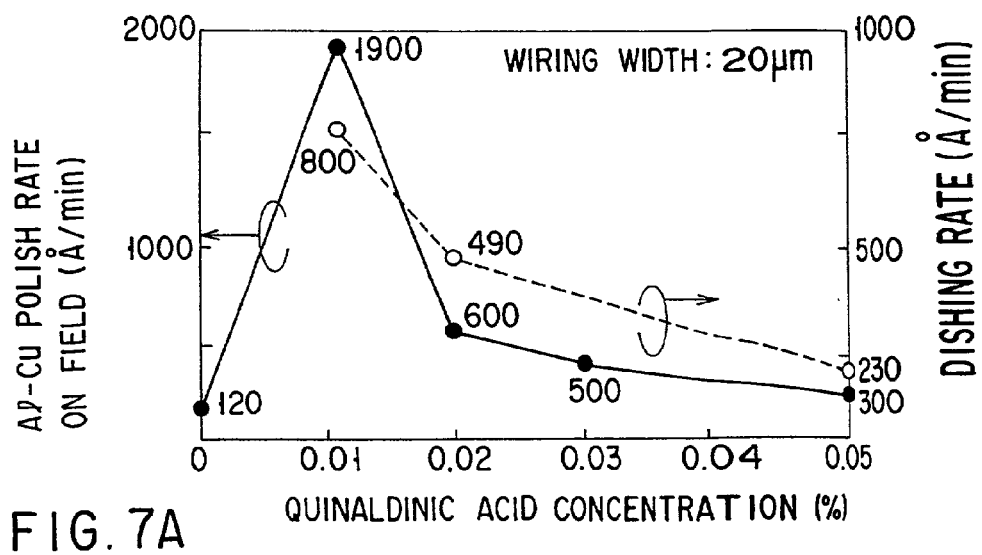
FIG. 7A is a characteristic graph showing Al polishing rates in the second embodiment in cases where quinaldic acid is added to a slurry containing mixture abrasives of silica and alumina, and an alumina-based slurry.
Figure 7B:
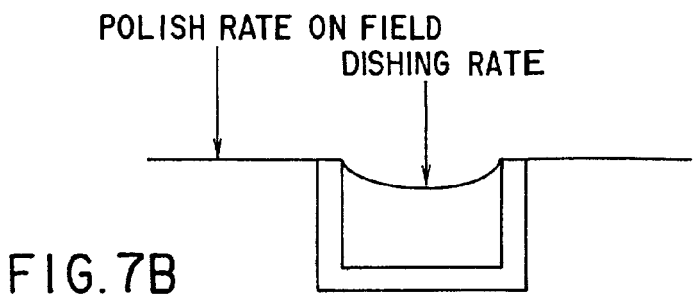
FIG. 7B illustrates a polishing rate and a dishing rate in the second embodiment.

With the slurry of the present invention, as shown in FIGS. 7A and 7B, the dishing rate can be made less than the polishing rate on the field. It is thus possible to form Damascene wiring with slight erosion. The reason appears to be that the interaction between the polishing pad and polishing abrasives is enhanced by quinaldic acid and this decreases the amount of free abrasives remaining in the trench, which will be a factor for dishing.

The slurry may not contain the oxidizing agent. Where excess portions are removed by CDE, CF$_4$/O$_2$ gas, for example, is used as a reaction gas.

THIRD EMBODIMENT

FIGS. 8A to 8D are cross-sectional views illustrating steps of a process of forming W Damascene wiring according to a third embodiment of the invention.

Figure 8A:
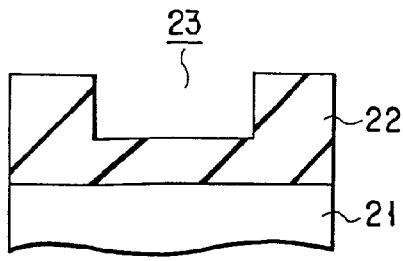
FIGS. 8A to 8D are cross-sectional views illustrating a process of forming W Damascene wiring according to a third embodiment of the invention.

To start with, as shown in FIG. 8A, an SiO$_2$ film 22 which serves as an interlayer insulating film is deposited on a silicon substrate 21 on which devices (not shown) are fabricated. A wiring trench 23 is then formed in a surface portion of the SiO$_2$ film 22.

Figure 8B:
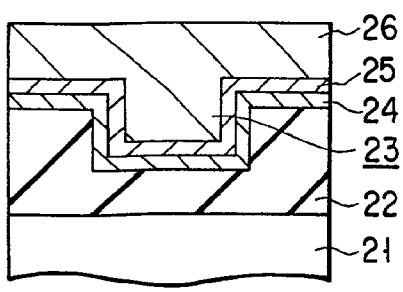

As is shown in FIG. 8B, a Ti liner film 24 with a thickness of 30 nm is deposited over an entire surface of the resultant structure. Then, a TiN liner film 25 is formed over a surface of the Ti liner 24 by a nitriding anneal process at 500° C. A W film 26 for filling the inside of the wiring trench 23 is deposited on the TiN liner film 25.

Figure 8C:
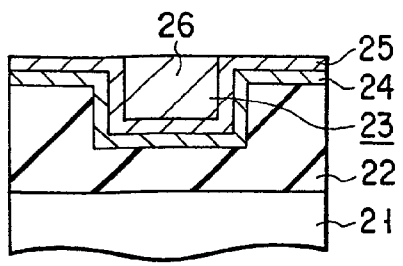

Subsequently, as illustrated in FIG. 8C, the W film 26 is polished by CMP until the surface of the TiN liner film 25 appears, using a slurry containing 3% of hydrogen peroxide as an oxidizing agent, 3% of succinic acid as a pH controlling agent (pH4), and 3% of mixture abrasives of silica (60%) and alumina (40%). The conditions for the CMP are: a down force=250 g/cm$^2$, a top ring rotational speed=50 rpm, and a table rotational speed=50 rpm.

Figure 8D:
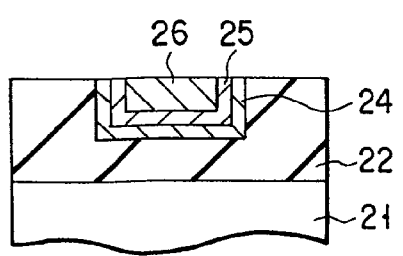

At last, as illustrated in FIG. 8D, the W film 26, TiN liner film 25 and Ti liner film 24 are polished by CMP until the surface of the silicon substrate 1 appears, using a slurry containing mixture abrasives (solid component: 0.5%) of silica (40%) and alumina (60%) as polishing abrasives. The conditions for the CMP are: a down force=300 g/cm$^2$, a top ring rotational speed=60 rpm, a table rotational speed=100 rpm, and a polishing time=1 minute. Thus, the formation of W Damascene wiring 26 is completed.

In the step of FIG. 8D, it is preferable that the polishing rate for the films 22, 24 and 25 is not high.

In the case of the slurry used in steps 8A to 8D, the polishing rate for the films 22, 24 and 25 falls within the range of 10-20 nm/min and it is prevented from increasing excessively. In addition, the films 22, 24 and 25 can be polished under the same conditions, and polishing with a large over-polishing margin and without dishing or thinning can be realized.

The conventional CMP for the W film is carried out using a strong acid of pH 1 to pH 2. In the present embodiment, however, the CMP for the W film can be carried out at a neutral region of pH 4-6. Therefore, the problem of erosion of the W film is overcome.

FOURTH EMBODIMENT

Figure 9A:
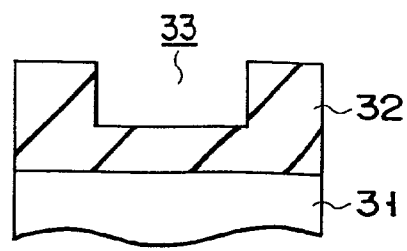
FIGS. 9A to 9D are cross-sectional views illustrating a process of forming Cu Damascene wiring according to a fourth embodiment of the invention.

FIGS. 9A to 9D are cross-sectional views illustrating steps of a process of forming Cu Damascene wiring according to a fourth embodiment of the invention. As shown in FIG. 9A, an SiO$_2$ film 32 which serves as an interlayer insulating film is deposited on a silicon substrate 31 on which devices are fabricated. A wiring trench 33 having a depth of 300 nm is then formed in a surface portion of the SiO$_2$ film 32.

Figure 9B:
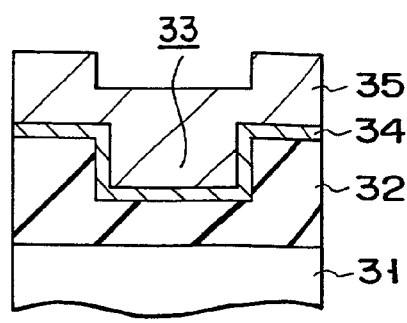

As is shown in FIG. 9B, a TaN film 34 with a thickness of 20 nm is deposited over an entire surface of the resultant structure. A Cu film 35 with a thickness of 600 nm is then deposited on the Ta film 34. Thereby, the wiring trench 33 is filled with the Cu film 35.

Figure 9C:
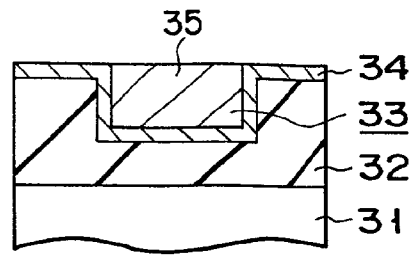

In a subsequent step shown in FIG. 9C, the Cu film 35 is polished until the surface of the TaN film 34 will appear, using a slurry having an adjusted pH of 8.5 and containing ammonium peroxodisulfate (0.5%) as an oxidizing agent, quinaldic acid (0.4%) as an oxidation inhibitor, mixture abrasives (0.5%) of silica (85%) and alumina (15%), KOH aqueous solution.

Figure 9D:
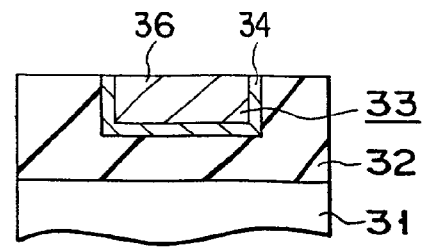

At last, as shown in FIG. 9D, touch-up CMP employed in the second embodiment is performed to complete formation of Cu Damascene wiring 36.

The present embodiment has the advantage that erosion can be suppressed. This advantage is achieved by the use of mixture abrasives.

In the slurry system, if silica is 100%, the abrasives which are negatively charged have high affinity to the Cu film which is positively charged. As a result, abrasives remain excessively on the surface of the Cu film and erosion progresses.

On the other hand, the silica-based mixture abrasives (silica: 85%; alumina: 15%) according to the present embodiment have a mechanical polishing force equal to the case where silica is 100%. In addition, since alumina which is present locally is positively charged, it is repelled from the Cu film. As a result, the abrasives are prevented from remaining and erosion is suppressed.

In the above-described embodiments, devices to which the present invention are applied are not referred to. Such devices are, for example, semiconductor memories such as DRAMS, logic hybrid circuits, logic circuits, etc.

The conductive films (Al film, W film, Cu film) which become wiring are not limited to those in the embodiments. The conductive film is, for example, a single-layer metal film formed of a metal selected from among the group containing Cu, Al, W, Ti, Mo, Nb, Ta and V, (in particular, W, Ti, Mo, Nb, Ta and V) or a laminated metal film formed of metals selected from among the group containing Cu, Al, W, Ti, Mo, Nb, Ta and V, or an alloy film, a nitride film, a boride film or an oxide film including as a main component a metal selected from among the group. With any one of these conductive film, dishing or thinning can be suppressed by varying a mixture ratio between alumina and silica.

When CMP is performed, it is preferable to form in advance an oxide film on a surface of the conductive film to be polished.

The above embodiments are directed to Damascene wiring, but the present invention is effective for dual Damascene wiring.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A polishing composition comprising a CMP slurry, wherein said CMP slurry comprises polishing abrasives containing a mixed-crystal abrasive of silica and alumina, said CMP slurry having a pH ranging from about 4 to about 7, and further wherein said CMP slurry further comprises at least one oxidizing agent.

2. A polishing composition according to claim 1, wherein said at least one oxidizing agent is chosen from $(NH_4)_2S_2O_8$ and $H_2O_2$.

3. A polishing composition comprising a CMP slurry, wherein said CMP slurry comprises polishing abrasives containing a mixed-crystal abrasive of silica and alumina, said CMP slurry having a pH ranging from about 4 to about 7. and further wherein said CMP slurry further comprises at least one compound chosen from oxidation surfactants, oxidation inhibitors, or organic acids.

4. A polishing composition according to claim 3, wherein said organic acids improve retention of the abrasives on a polishing pad.

* * * * *

UNITED STATES PATENT AND TRADEMARK OFFICE
CERTIFICATE OF CORRECTION

| | |
|---|---|
| PATENT NO. | : 7,364,667 B2 |
| APPLICATION NO. | : 10/155015 |
| DATED | : April 29, 2008 |
| INVENTOR(S) | : Minamihaba et al. |

It is certified that error appears in the above-identified patent and that said Letters Patent is hereby corrected as shown below:

Title page, item (60), line 1, change "Provisional" to --Division of--.

Claim 3, column 8, line 19, change "7. and" to --7, and--.

Signed and Sealed this

Twenty-second Day of July, 2008

JON W. DUDAS
*Director of the United States Patent and Trademark Office*

UNITED STATES PATENT AND TRADEMARK OFFICE
CERTIFICATE OF CORRECTION

PATENT NO. : 7,364,667 B2 Page 1 of 1
APPLICATION NO. : 10/155015
DATED : April 29, 2008
INVENTOR(S) : Minamihaba et al.

It is certified that error appears in the above-identified patent and that said Letters Patent is hereby corrected as shown below:

Title page, item (60), line 1, change "Provisional" to --Division of--.

Claim 3, column 8, line 19, change "7. and" to --7, and--.

Signed and Sealed this

Fourth Day of November, 2008

JON W. DUDAS
*Director of the United States Patent and Trademark Office*

UNITED STATES PATENT AND TRADEMARK OFFICE
CERTIFICATE OF CORRECTION

PATENT NO.         : 7,364,667 B2
APPLICATION NO. : 10/155015
DATED              : April 29, 2008
INVENTOR(S)        : Gaku Minamihaba et al.

It is certified that error appears in the above-identified patent and that said Letters Patent is hereby corrected as shown below:

This certificate vacates the Certificate of Correction issued November 4, 2008. The certificates is a duplicate of the Certificate of Correction issued July 22, 2008. All requested changes were included in the Certificate of Correction issued July 22, 2008.

Signed and Sealed this

Twenty-fifth Day of November, 2008

JON W. DUDAS
*Director of the United States Patent and Trademark Office*